(12) United States Patent
Jung (10) Patent No.: US 7,103,133 B2
(45) Date of Patent: Sep. 5, 2006

(54) REGISTER CONTROLLED DELAY LOCKED LOOP CIRCUIT

(75) Inventor: Hea-Suk Jung, Kyoungki-do (KR)

(73) Assignee: Hynix Semiconductor Inc., Gyunggi-do (KR)

(*) Notice: Subject to any disclaimer, the term of this patent is extended or adjusted under 35 U.S.C. 154(b) by 759 days.

(21) Appl. No.: 10/223,434

(22) Filed: Aug. 19, 2002

(65) Prior Publication Data

US 2003/0108139 A1 Jun. 12, 2003

(30) Foreign Application Priority Data

Dec. 12, 2001 (KR) ................................ 2001-78439

(51) Int. Cl.
*H03D 3/24* (2006.01)
*H03L 7/06* (2006.01)
(52) U.S. Cl. ..................... 375/376; 375/375; 327/158
(58) Field of Classification Search ........ 375/375–376; 327/158
See application file for complete search history.

(56) References Cited

U.S. PATENT DOCUMENTS 6,144,713 A * 11/2000 Eto ............................. 375/375
6,222,894 B1 * 4/2001 Lee ............................. 375/376

2002/0105848 A1 * 8/2002 Tomita et al. ............... 365/226

FOREIGN PATENT DOCUMENTS

KR 1998-0069826 A 10/1998
KR 2000-0011729 A 2/2000

OTHER PUBLICATIONS

Hatakeyama et al., A 256-Mb SDRAM Using a Regiser-Contolled Digital DLL, IEEE Journal of Solid-State Circuits, vol. 31, No. 11 Nov. 1997.*

* cited by examiner

*Primary Examiner*—Khai Tran
*Assistant Examiner*—Cicely Ware
(74) *Attorney, Agent, or Firm*—Marshall, Gerstein & Borun LLP (57) ABSTRACT

A register controlled delay locked loop (DLL) includes a clock divider, a shift controller, a delay unit and a delay model to synchronize an external clock signal with an internal clock. The register controlled DLL further includes a reset signal generator to generate a reset signal used to initialize the delay locked loop (DLL), a phase comparator to initialize a phase comparison signal in which the phase of a feedback clock signal delayed by a reference clock signal and the delay model is compared and outputted into a predetermined signal by using a comparison enable signal having an inverse phase to that of the reset signal, and a shift register to block an electric current running on a first latch of a plurality of latches with the reset signal during the initialization.

18 Claims, 12 Drawing Sheets

REGISTER CONTROLLED DELAY LOCKED LOOP CIRCUIT

FIELD OF THE INVENTION

The present invention relates to a register controlled delay locked loop (DLL) circuit and a control method thereof.

BACKGROUND OF THE RELATED ART

Generally, clock signals are used as a reference for setting the operation timing in a system or a circuit, or they are used to secure fast operation without error. When a clock signal from an external clock source is used inside a circuit, a clock skew occurs in the circuit. Thus, a delay locked loop (DLL) is used to get the internal clock signal to have the same phase as the external clock.

Significant elements required for a DLL are small area, little jitter and fast locking time. These characteristics may still be required for next-generation semiconductor devices that consumes low electric power and operates fast. However, conventional technologies have fulfilled only a few parts of these requirements, and thus have showed limitations on the low-power and fast operation.

Compared with a phase locked loop (PLL), a DLL has an advantage that it is less affected by noise so it is used widely for synchronous semiconductor memories including a double data rate synchronous dynamic RAM (DDR SDRAM). Among DLLs, most frequently used is a register controlled DLL, which will be described in detail along with the disadvantages of related conventional technologies, hereinafter.

Figure 1:
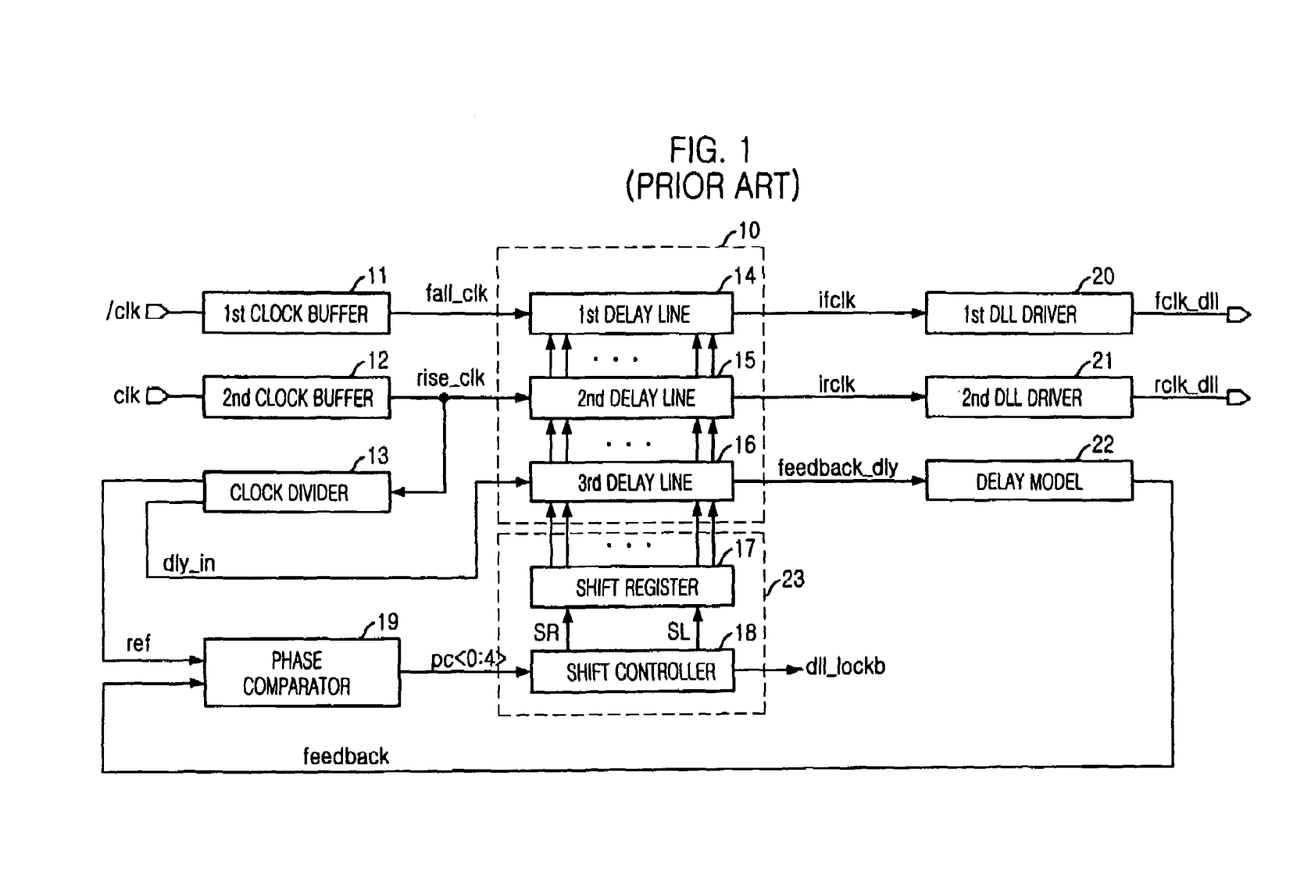
FIG. 1 is a block diagram illustrating a register controlled delay locked loop (DLL) of a conventional double data rate (DDR) synchronous dynamic RAM (SDRAM)

FIG. 1 is a block diagram illustrating a register controlled delay locked loop (DLL) of a conventional double data rate (DDR) synchronous dynamic RAM (SDRAM).

A register controlled DLL of a conventional DDR SDRAM comprises a delay block 10, a first clock buffer 11 to receive an external clock inverse-signal /clk for generating an internal clock signal fall_clk in synchronization with a falling edge of an external clock signal clk, a second clock buffer 12 to receive an external clock signal clk for generating an internal clock signal rise_clk in synchronization with a rising edge of an external clock signal clk, and a clock divider 13 to divide the internal clock signal rise_clk by 1/n (n being a positive integer, commonly n=8) and to output a delay monitoring clock signal dly_in and a reference clock signal ref. The delay block 10 includes a first delay line 14 to delay the internal clock signal fall_clk, a second delay line 15 to delay the internal clock signal rise_clk, and a third delay line 16 to delay the delay monitoring clock signal dly_in. The register controlled DLL also includes a first DLL driver 20 to drive a DLL clock signal fclk_dll in response to an output ifclk of the first delay line 14, a second DLL driver 21 to drive a DLL clock rclk_dll in response to an output signal irclk of the second delay line 15, a delay model 22 to receive an output feedback_dly of the third delay line 16 and has the clock signal feedback_dly go through the same delaying condition as the actual clock path, a phase comparator 19 to compare an output signal feedback of the delay model 22 with the reference clock signal ref in their phase, and a delay control signal generation block 23.

Here, the delay model 22 (also called a replica circuit) includes a dummy clock buffer, a dummy output buffer and a dummy load. The control signal generation block 23 includes a shift register 17 and a shift controller 18 to control the first to third delay lines 14, 15, 16 in the delay block 10. The shift register 17 determines an amount of delay time in the first to third delay lines 14, 15, 16. The shift controller 18 outputs a delay locking signal dll_lockb, that indicates the completion of a locking and shift control signals SR and SL for controlling the delay time of the first to third delay lines 14, 15, 16 based on the value stored in the shift register 17 in response to a phase comparison signals PC<0:4> outputted from the phase comparator 19.

The operation of a conventional register controlled DLL constructed as above will be described hereinafter. First, the first clock buffer 11 generates the internal clock signal fall_clk in response to the falling edge of an external clock signal clk. The second clock buffer 12 also generates the internal clock signal rise_clk in response to the rising edge of an external clock signal clk. The clock divider 13 divides the internal clock signal rise_clk into the two signals, i.e., the reference clock signal ref and the delay monitoring clock signal dly_in whenever the nth external clock signal is inputted into the DLL where "n" is a function of the clock divider 13.

In the initial operation, the divided clock signal dly_in passes through only one unit delay element in the third delay unit 16 of the delaying block 10. The third delay unit 16 outputs the clock signal feedback_dly, which goes through the delay model 22 again. The clock signal feedback_dly is delayed and outputted as the output signal feedback by the delay model 22.

The phase comparator 19 compares a rising edge of the reference clock signal ref with a rising edge of the feedback clock signal feedback and generates phase comparison signals PC<0:4>. The shift controller 18 outputs shift right and left signals SR and SL for controlling the shift direction of the shift register 17 in response to the phase comparison signals PC<0:4>. The shift register 17 determines the amount of delay time the first to third delay lines 14, 15, 16 in response to the shift right or left signal SR or SL. When a shift right signal SR is issued, the register 17 makes the first to third delay units 14, 15, 16 shift in a right direction whereas a shift left signal SL is issued, the register makes the first to third delay units 14, 15, 16 shift in a left direction.

A locking is achieved in a moment when the two clock signals have a minimum jitter between the feedback clock signal of controlled delay amount with the reference clock signal ref. As a delay locking signal dll_lockb is outputted from the shift controller 18, the first and second DLL drivers 20 and 21 are activated, and the DLL clock signals fclk_dll and rclk_dll operate with the same phase as the external clock signal clk.

In general, the DLL operates as described above and a circuit operates by using an internal clock signal determined thereby. Because data are not transmitted outside during a self-refresh operation, the internal clock signals by the operation of the DLL are not needed. As a result, the shift register 17 is reset and all DLL internal operations are reduced as much as possible. The self-refresh operation of the DLL will be described more in detail, hereinafter.

Because the first and second clock buffers 11 and 12 do not receive any external clock signals clk and /clk, the internal clock signals fall_clk and rise_clk are in a low state 'L'. As the clock divider 13 is operated by receiving the internal clock signals fall_clk and rise_clk outputted from the first and second clock buffers 11, 12, the delay monitoring clock signal dly_in is kept in a low state 'L' and the reference clock, in a high state 'H'.

Figure 2:
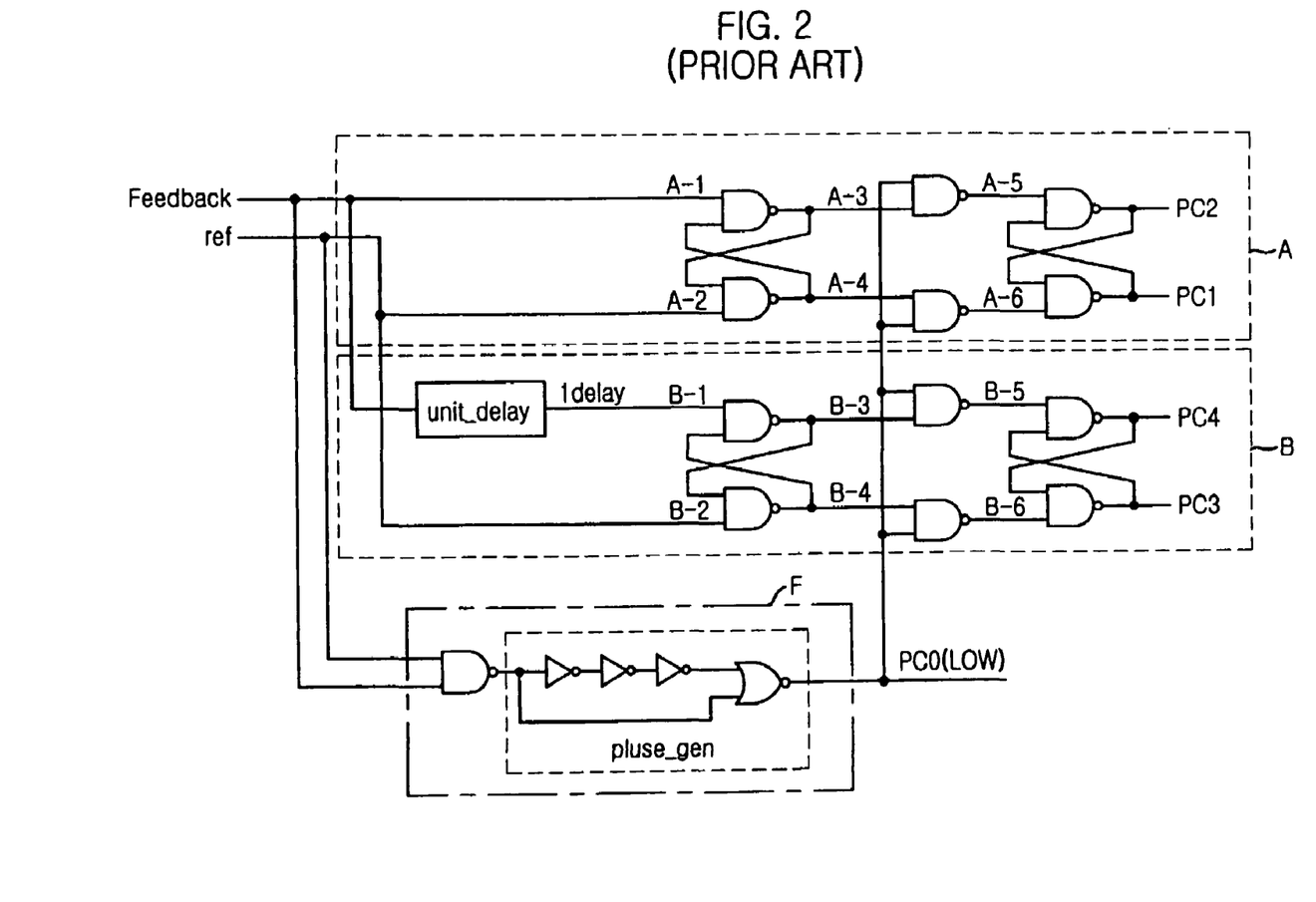
FIG. 2 is a circuit diagram depicting a phase comparator in a conventional register controlled DLL.
Figure 3:
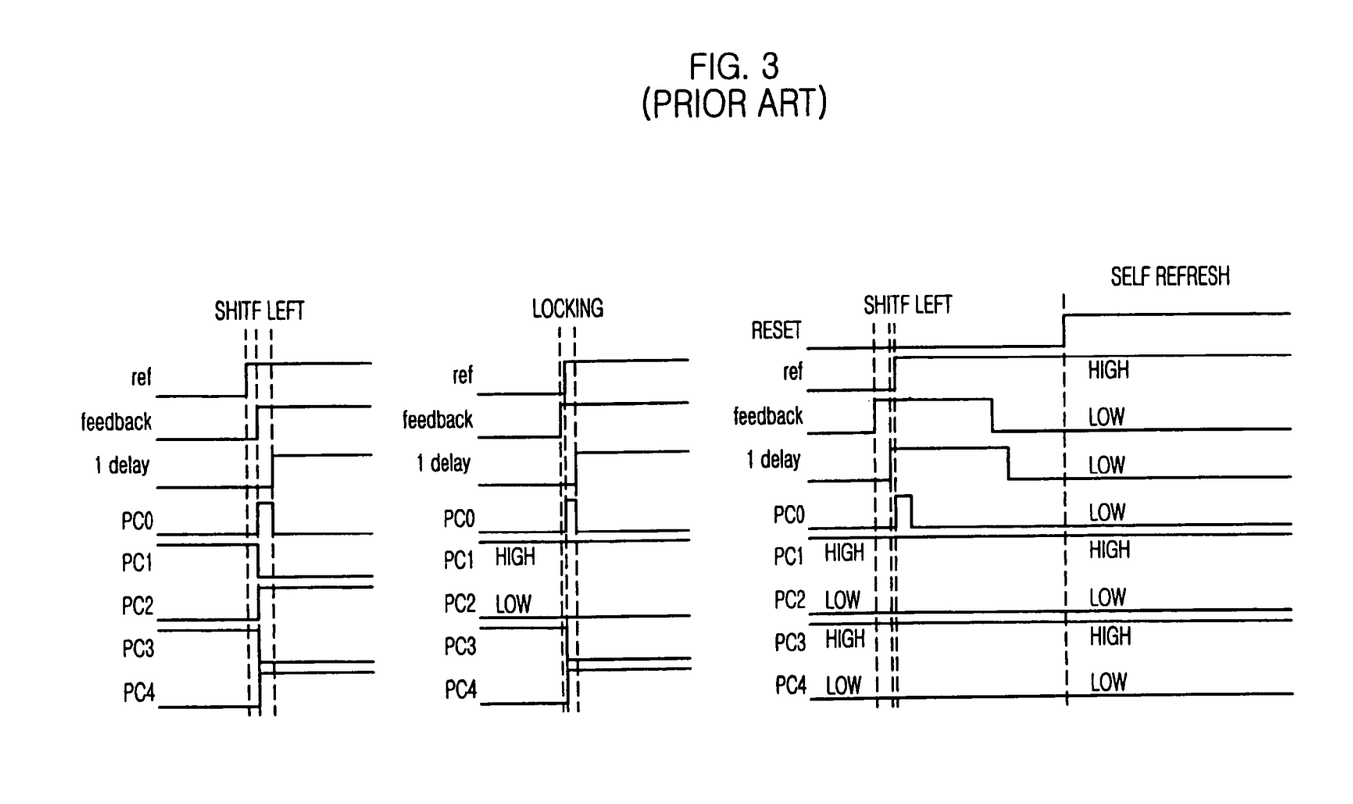
FIG. 3 is a timing diagram of a phase comparator in a conventional register controlled DLL.

FIG. 2 is a circuit diagram depicting a phase comparator 19 in the conventional register controlled DLL, and FIG. 3 is a timing diagram of the phase comparator 19 in the conventional register controlled DLL. The phase comparator 19 receives reference clock signal ref in a high state 'H' from the clock divider 13 and feedback clock signal feedback in a low state 'L' from the delay lines and the delay model, and the phase comparison signal PCO stays in the low state 'L'. As the phase comparison signal PCO is in a low state 'L', nodes A-5, A-6, B-5 and B-6 are maintained at a high state 'H', and the NAND latch circuit coming thereafter continues to latch the values it has kept. If the phase comparison signals PC1 and PC3 are in a high state 'H', the two signals are maintained in the high state 'H' continuously during the self-refresh operation and the phase comparison signals PC2 and PC4 latches a low state 'L'.

Figure 4A:
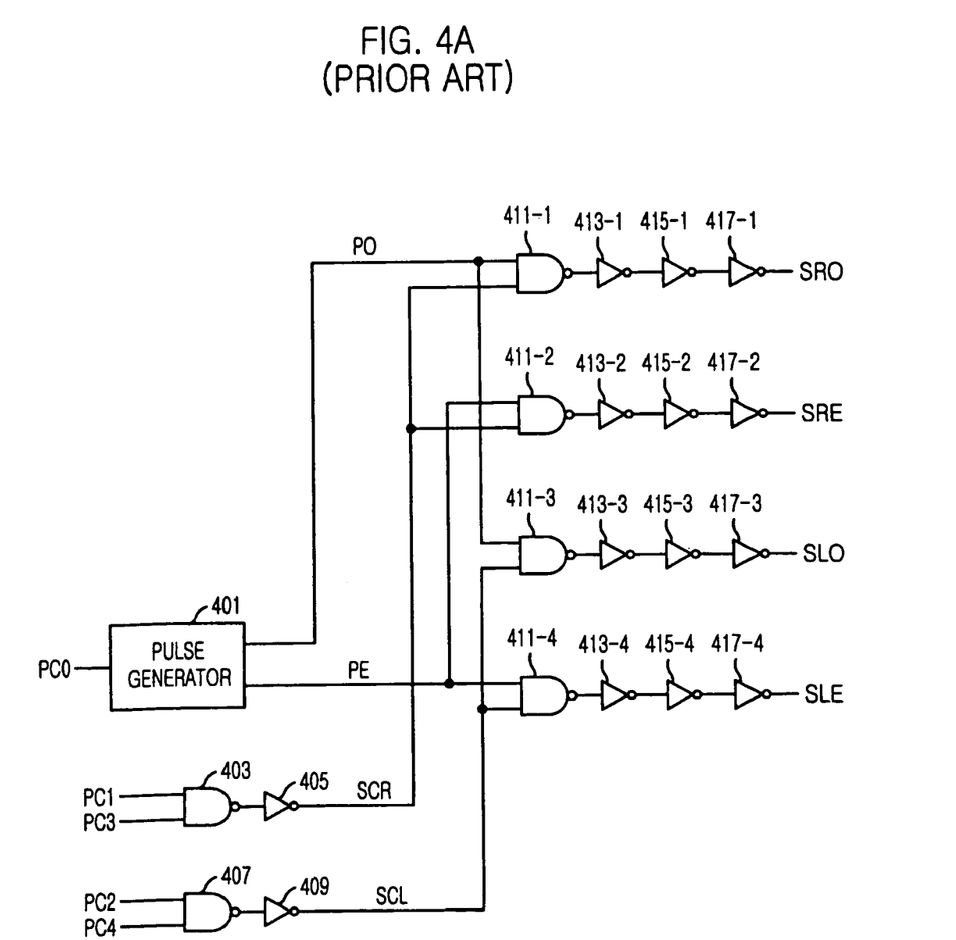
FIG. 4A is a circuit diagram of a shift controller in a conventional register controlled DLL.
Figure 4B:
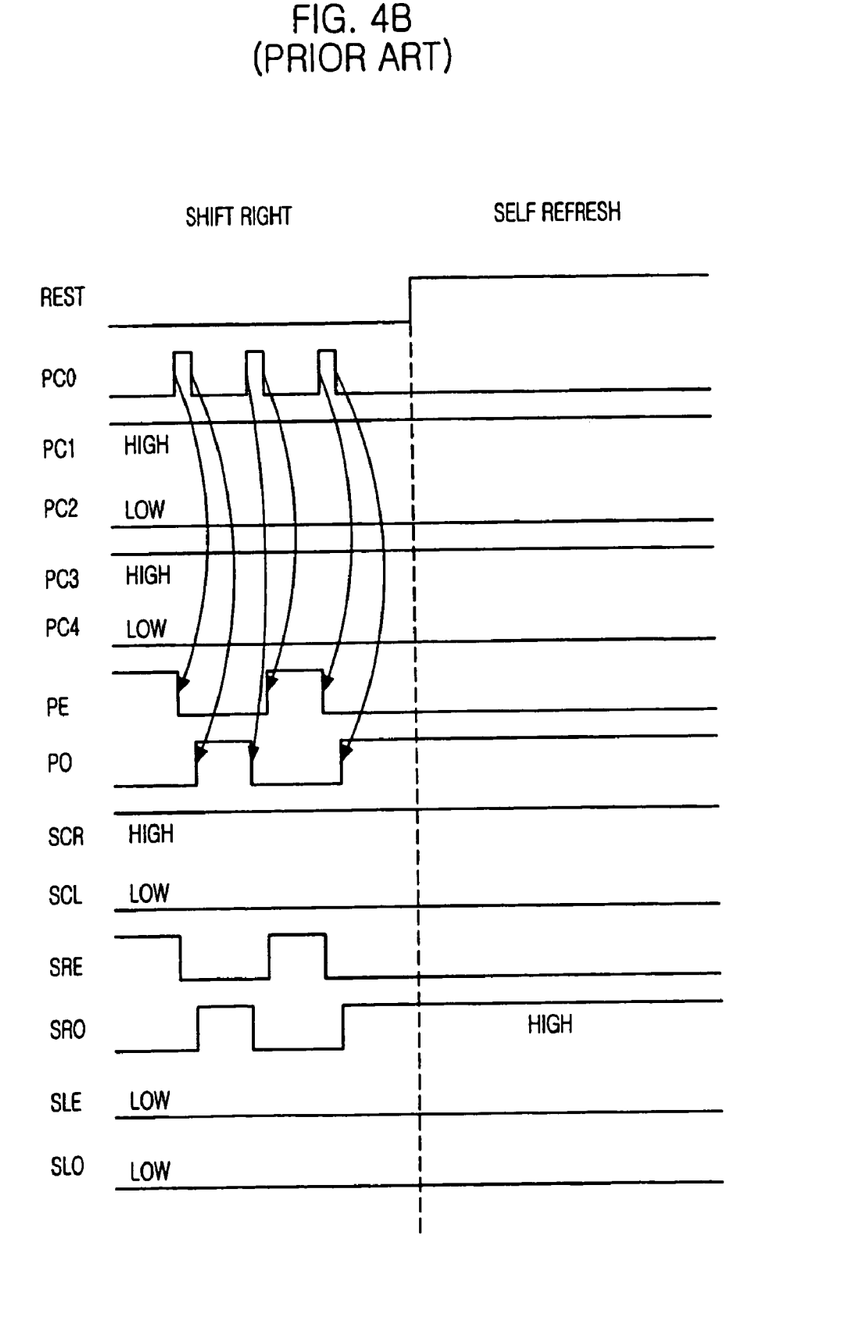
FIG. 4B is a timing diagram of a shift controller in a conventional register controlled DLL.

FIG. 4A is a circuit diagram of a shift controller 18 in a conventional register controlled DLL, and FIG. 4B is a timing diagram of a shift controller 18 in a conventional register controlled DLL. The shift controller 18 receives phase comparison signals PC<0:4> generated in the phase comparator 19 and generates a signal controlling the shift register 17.

Because the phase comparison signal PC0 is in a low state 'L', an even pulse signal PE and an odd pulse signal PO outputted from a pulse generator 401 are maintained in the low state 'L' and the high state 'H', respectively. The pulse generator 401 receives the phase comparison signal PC0 and generates new pulse signals in accordance with the rising edge and falling edge. In case the phase comparison signals PC1 and PC3 are all in a high state 'H', a shift right control signal SCR is generated through a NAND gate 403 and an inverter 405. In case the phase comparison signals PC2 and PC4 are all in a high state 'H', a shift left control signal SCL is generated through a NAND gate 407 and an inverter 409.

Combinations of the even pulse signal PE, odd pulse signal PO, shift right control signal SCR, and shift left control signal SCL generate a shift right odd signal SRO, shift right even SRE, shift left odd SLO, and shift left even SLE. In particular, the phase comparison signals PC1 and PC3 are in a high state 'H' and the even pulse signal PE is in a high state 'H', the shift right even SRE is generated. If the phase comparison signals PC1 and PC3 are in a high state 'H' and the odd pulse signal PO is in a high state 'H', the shift right odd SRO is generated. If the phase comparison signals PC2 and PC4 are in a high state 'H' and the even pulse signal PE is in a high state 'H', the shift left even SLE is generated. If the phase comparison signals PC2 and PC4 are in a high state 'H' and the odd pulse signal PO is in a high state 'H', the shift left odd SLO is generated. In short, during the self-refresh operation, one of the shift right even SRE, shift right odd signal SRO, shift left even SLE and shift left odd SLO signals are maintained in the high state 'H' continuously by the value that had been kept before the self-refresh operation entry.

Figure 5:
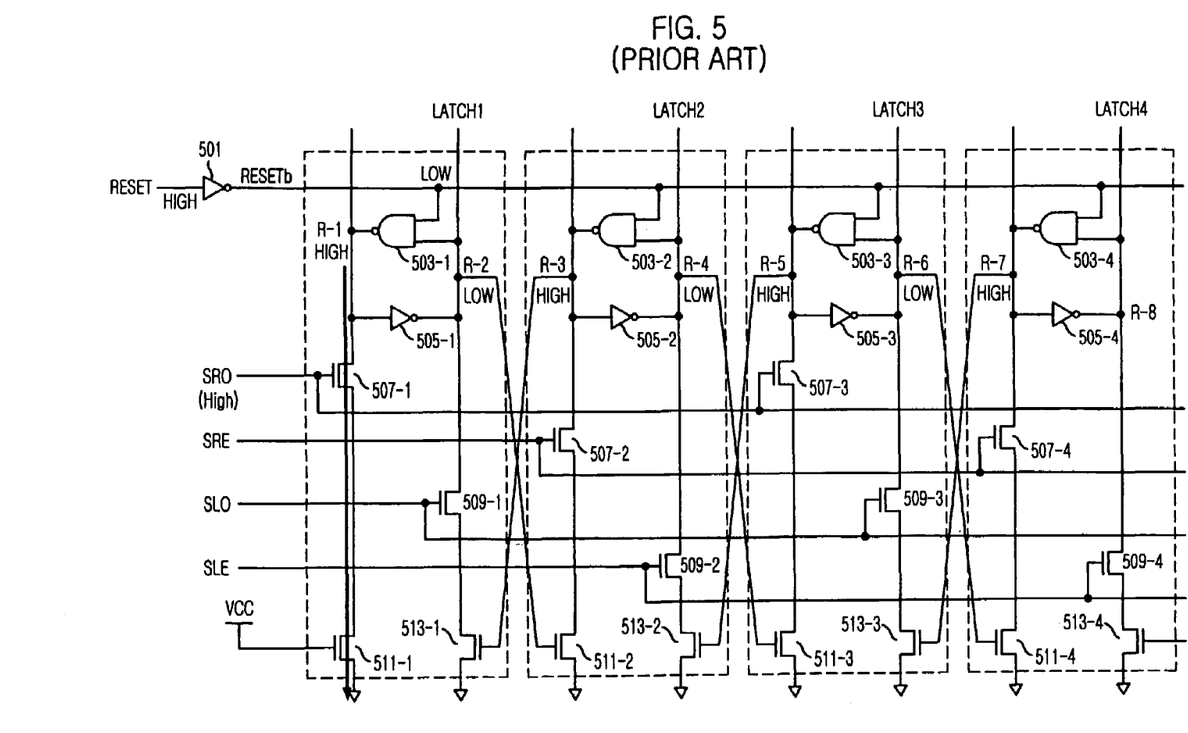
FIG. 5 is a circuit diagram of a shift register in a conventional register controlled DLL.

FIG. 5 is a circuit diagram of a shift register 17 in a conventional register controlled DLL. During the self-refresh operation, the shift register 17 receives a reset signal in a high state 'H' and resets all the values it has. That is, if the reset signal is in a high state 'H', it passes through the inverter 501 and is converted into a state where a reset bar signal is 'L'.

To describe the operation of LATCH1, a NAND gate 503-1 receiving a reset bar signal converts the voltage level on node R-1 into a high state 'H', and the inverter 505-1 receiving the value on node R-1 converts the voltage level on node R-2 into a low state 'L'. Likewise, in a LATCH2, a NAND gate 503-2 receiving the reset bar signal converts the voltage level on node R-3 into a high state 'H', and the inverter 505-2 receiving the value on node R-3 converts the voltage level on node R-4 into a low state 'L'. Consequently, the NMOS transistor 511-2 receiving the value on node R-2 is turned off, while the NMOS transistor 513-1 receiving the value on node R-3 is turned on.

Here, the NMOS transistor 511-1 is turned on as an external power Vcc is connected to its gate. Therefore, when the SRO signal is in a high state 'H' during the period of self-refresh operation, the NMOS transistor 507-1 and the NMOS transistor 511-1 are all turned on, and because the NAND gate 503-1 receiving a reset bar signal continues to keep the voltage level on node R-1 in a high state 'H', an unnecessary electric current (marked with a thick line in FIG. 5) gets to run during the period of the self-refresh operation.

DETAILED DESCRIPTION OF THE EXAMPLES

Figure 6:
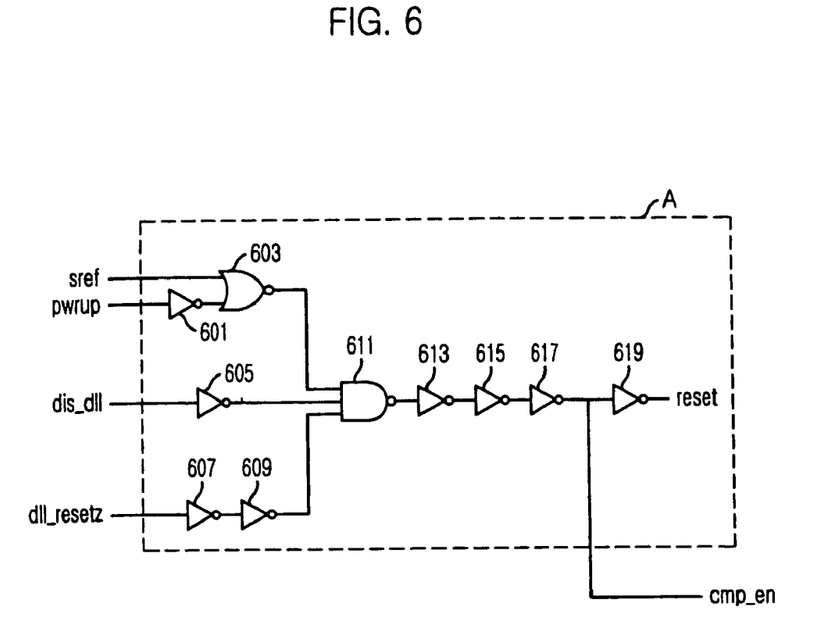
FIG. 6 represents a circuit diagram of a register controlled DLL constructed in accordance with the teachings of the present invention.

Referring to FIG. 6, the illustrated register controlled delay locked loop (DLL) includes a plurality of inverters 601, 605, 607, 609, 613, 615, 617, 619, a NOR gate 603, and a NAND gate 611.

A conventional DLL controller located around a shift register 17 outputs a reset signal to the shift register 17 and resets the value contained therein, whenever (a) a DLL performs a self-refresh operation, (b) before power is up, (c) when a signal (disable dll mode) for conducting all operations without using the DLL is received, and (d) when a signal (dll reset mode) for starting a new locking operation is received.

Accordingly, a reset signal converted into a high state 'H' is generated when any one of a signal sref, a signal pwrup, a signal dis_dll, and a signal dll_resetz is used. The signal sref is for maintaining the high state 'H' during the self-refresh operation, the signal pwrup is for maintaining the low state 'L' before power is up, the signal dis_dll is for maintaining the high state 'H' during a disable dll mode, and the signal dll_resetz is for maintaining the low state 'L' during a dll reset mode. That is, when none of the four signals is used, the reset signal is maintained in the low state 'L'.

Located around the shift register 17, the DLL controller of the present invention also generates a comparison enable signal cmp_en having the inversed value of the reset signal along with the reset signal. A signal is withdrawn from an inverter 617 before the inverter 619 that outputs a reset signal. Therefore, the comparison enable signal cmp_en for maintaining the low state 'L' can be obtained when any one of a signal sref for maintaining the high state 'H' during the self-refresh operation, a signal pwrup for maintaining the low state 'L' before power is up, a signal dis_dll for maintaining the 'H' state during the disable dll mode, a signal dll_resetz for maintaining the 'L' state during the dll reset mode is used. That is, when none of the four signals is used, the comparison enable signal cmp_en is maintained in the high state 'H'.

Here, the comparison enable signal cmp_en does not necessarily have to be withdrawn from the DLL controller alone. The same signal can be withdrawn as well when an inverter is set up in a phase comparator 19, which is described in detail below, and a reset signal is inputted to it.

Figure 7:
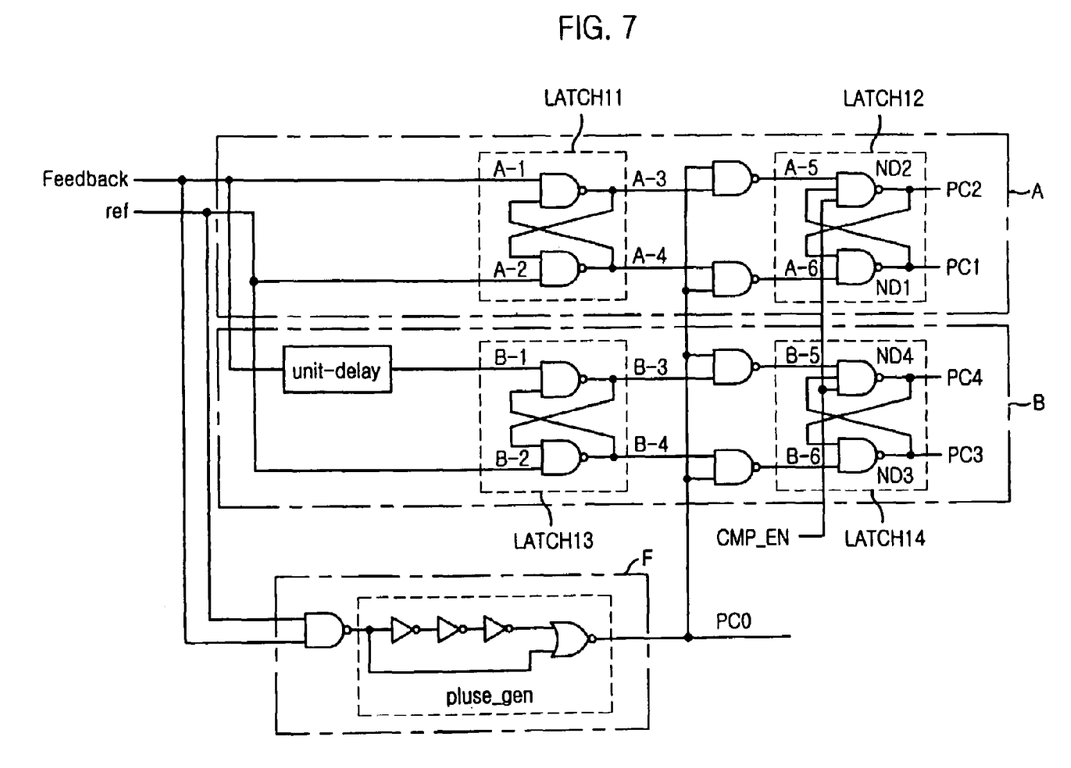
FIG. 7 shows a circuit diagram of a phase comparator in a register controlled DLL constructed in accordance with the teachings of the present invention.
Figure 8:
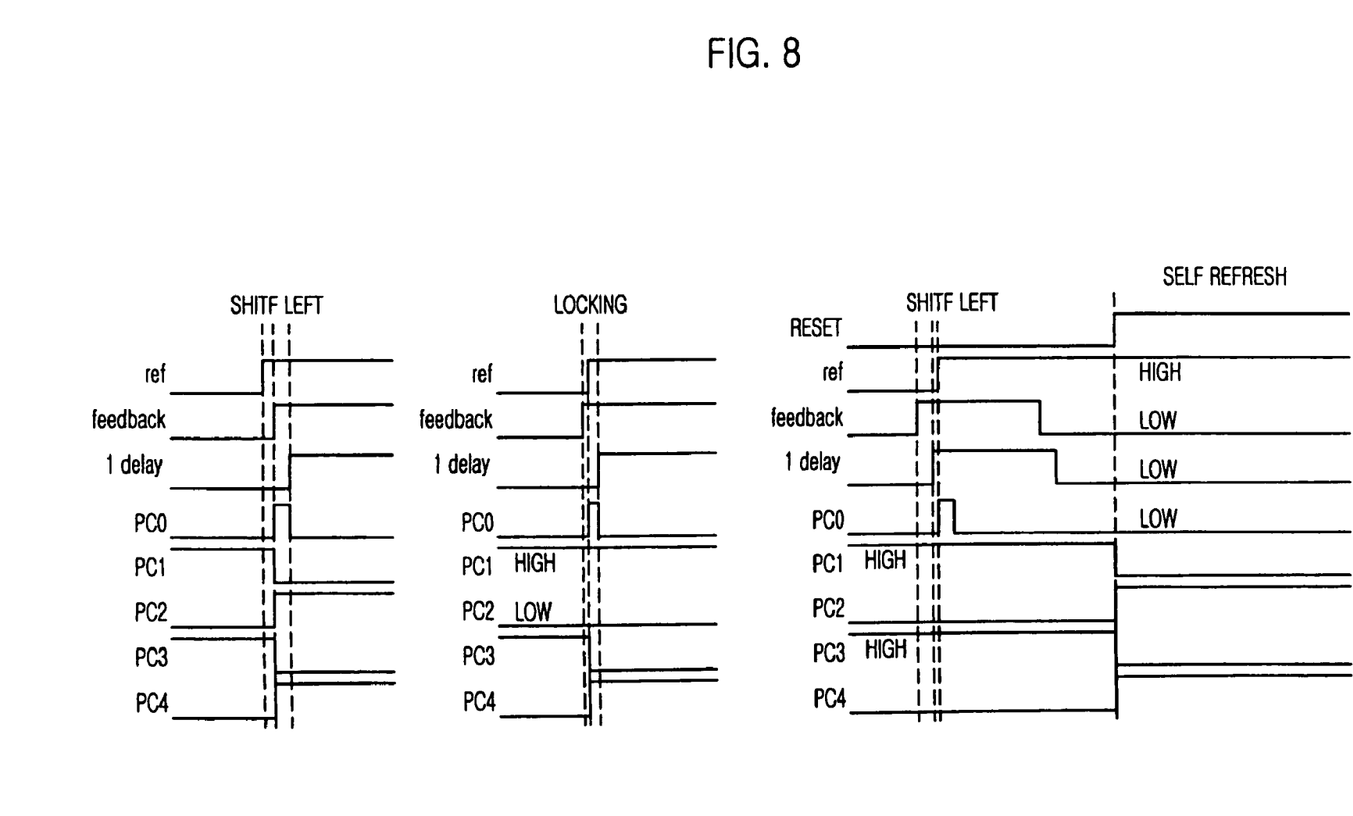
FIG. 8 depicts a timing diagram of a phase comparator in a register controlled DLL constructed in accordance with the teachings of the present invention.

FIG. 7 shows a circuit diagram of a phase comparator 19 in a register controlled DLL, and FIG. 8 depicts a timing diagram of a phase comparator 19 in a register controlled DLL. FIG. 7 shows a difference from a conventional phase comparator shown in FIG. 2 in that three input signals including the comparison enable signal cmp_en, which is an inverted signal of a reset signal, are used as inputs to the NAND gates ND1 and ND2 of LATCH12 and LATCH14. While the comparison enable signal cmp_en is in a low state 'L', the phase comparison signals PC2 and PC4 outputted from the NAND gates ND2 and ND4 receiving the comparison enable signal are maintained in the high state 'H'. The phase comparison signals PC1 and PC3 outputted from the NAND gates ND1 and ND3 receiving the output signals of the NAND gates ND2 and ND4 are maintained in the low state 'L'. Thus, the phase comparator receives the input signals A-5 and A-6 of the LATCH12 composed of ND1 and ND2 and the input signals B-5 and B-6 of the LATCH14 composed of ND3 and ND4 while the comparison enable signal cmp_en performs normal operation in a high state 'H'.

Also, there is a high state 'H' reference clock signal ref outputted from the clock divider 13 and a low state 'L' feedback clock signal in which a delay monitoring clock signal delay_in is outputted after passing through a third delay line 16 and a delay model 22. Accordingly, the phase comparison signal PC0 generated are maintained in the low state 'L' when the reference clock signal and the feedback clock signal are all in a high state 'H'.

Figure 9A:
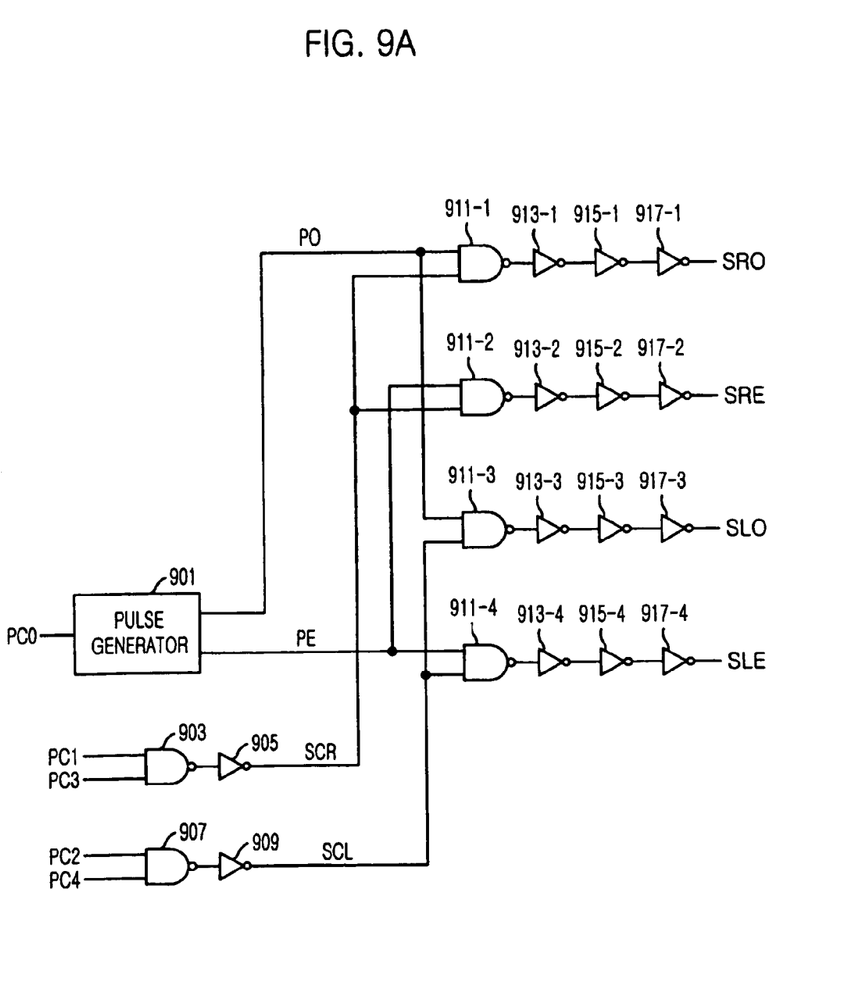
FIG. 9A shows a circuit diagram of a shift controller in a register controlled DLL constructed in accordance with the teachings of the present invention.

Referring to FIG. 9A, the shift controller 18 that receives the phase comparison signals PC<0:4> generated by the phase comparator 19 and generates a signal controlling the shift register 17, is the same as a conventional shift controller shown in FIG. 4.

Figure 9B:
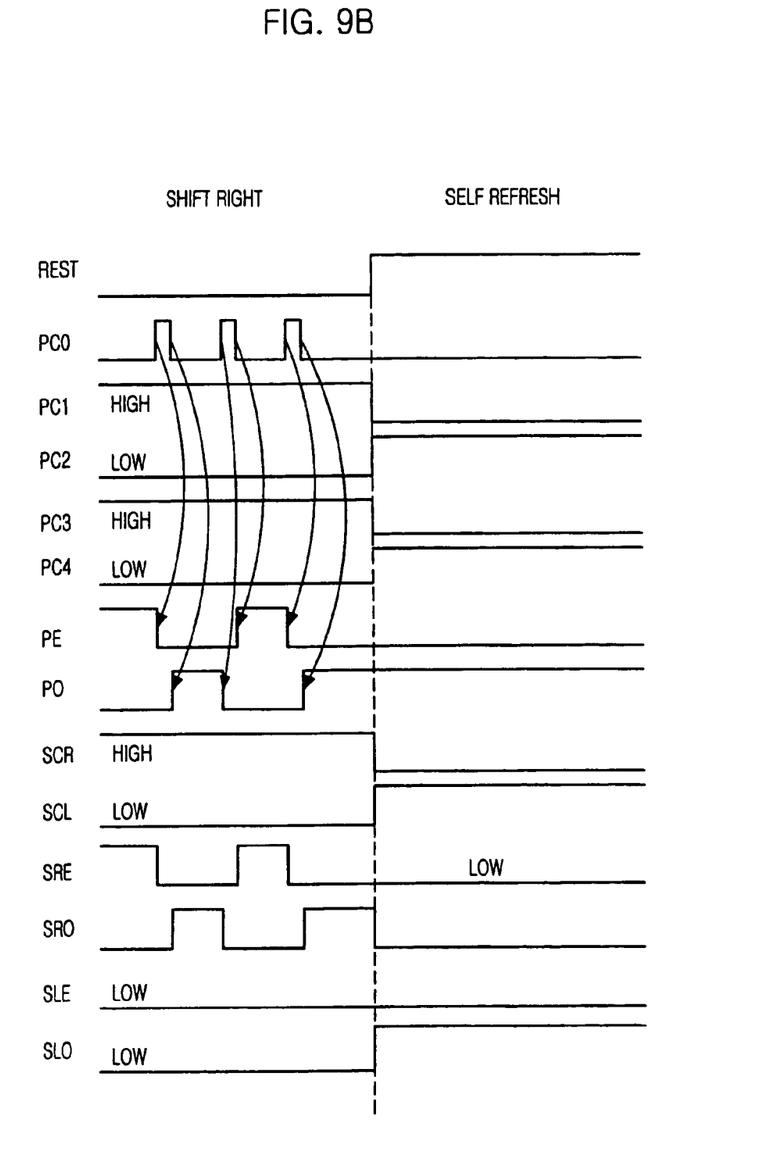
FIG. 9B illustrates a timing diagram of a shift controller in a register controlled DLL constructed in accordance with the teachings of the present invention.

As shown in FIG. 9B, a shift right control signal SCR is not generated because the phase comparison signals PC1 and PC3 are in a low state 'L', and the shift left control signal SCL is generated because the phase comparison signals PC2 and PC4 are in a high state 'H' while the comparison enable signal cmp_en is in a low state 'L'. A shift right odd signal SRO, shift right even signal SRE, shift left odd signal SLO and shift left even SLE signal are generated by the combinations of an even pulse signal PE, odd pulse signal PO, shift right control signal SCR and shift left control signal SCL. In particular, when the phase comparison signals PC1 and PC3 are in a low state 'L' and the even pulse signal PE is in a high state 'H', the shift right even SRE is not generated. If the phase comparison signals PC1 and PC3 are in a low state 'L' and the odd pulse signal PO is in a high state 'H', the shift right odd signal SRO is not generated. Also, when the phase comparison signals PC2 and PC4 are in a high state 'H' and the even pulse signal PE is in a high state 'H', the shift left even SLE is generated. If the phase comparison signals PC2 and PC4 are in a high state 'H' and the odd pulse signal PO is in a high state 'H', the shift left odd signal SLO is generated.

In short, while the comparison enable signal cmp_en is in a low state 'L', the shift right even SRE or shift right odd signal SRO is not generated, and either the shift left even SLE or shift left odd signal SLO is maintained in the high state 'H'.

Figure 10:
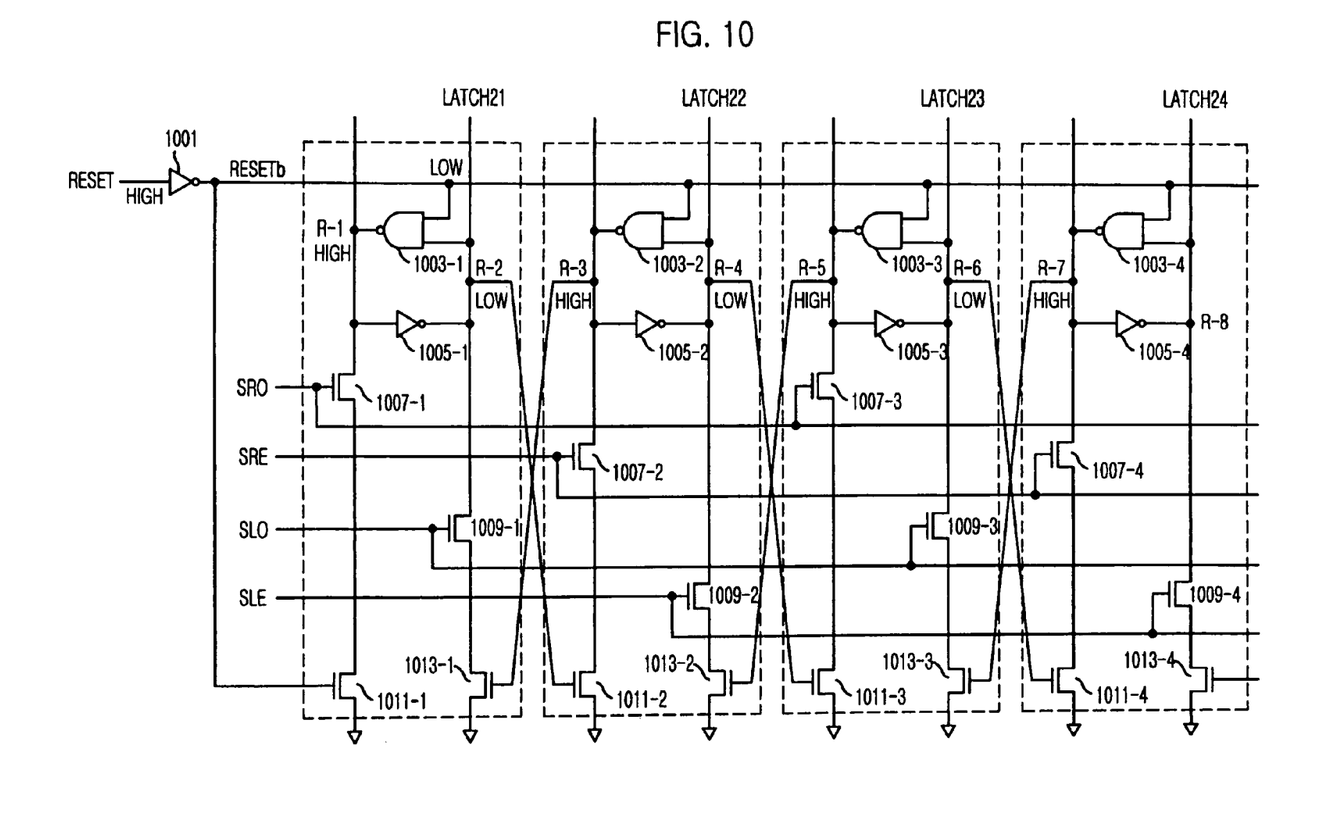
FIG. 10 represents a circuit diagram of a shift register in a register controlled DLL constructed in accordance with the teachings of the present invention.

Referring to FIG. 10, a reset bar signal is used for a gate operating power of an NMOS transistor on the ground voltage level of the first latch group and instead of an external voltage Vcc being supplied thereto.

The reset signal generated and outputted from the DLL controller of FIG. 6 goes through an inverter 1001 and generates a reset bar signal resetb, which enters the NAND gates 1003-1, 1003-2, 1003-3, 1003-4 of the latches LATCH21, LATCH22, LATCH23, LATCH24. The reset signal converts the outputs R-1, R-3, R-5, R-7 of the NAND gates 1003-1, 1003-2, 1003-3, 1003-4 into a high state 'H', and passes through the inverters 1005-1, 1005-2, 1005-3, 1005-4 receiving the outputs R-1, R-3, R-5, R-7. Further, the reset signal resets the output ends R-2, R-4, R-6, R-8 of the inverters 1005-1, 1005-2, 1005-3, 1005-4 in a low state 'L'.

The shift register 17 receives a reset signal that is converted into a high state 'H' during the self-refresh operation and resets all the values it has. When the reset signal is converted into a high state 'H', the reset bar signal resetb is converted to a low state 'L' through the inverter 1001.

To take a look at the operation of the LATCH21 first, the NAND gate 1003-1 that receives the reset bar signal resetb converts the value on node R-1 into a high state 'H', and the inverter 1005-1 receiving the value on node R-1 converts the value on node R-2 into a low state 'L'. In case of the LATCH22, the NAND gate 1003-2 receiving the reset bar signal resetb converts the value on node R-3 into a high state 'H', and the inverter 1005-2 receiving the value on node R-3 converts the value on node R-4 into a low state 'L'. In LATCH23 as well, the NAND gate 1003-3 receiving the reset bar signal resetb converts the value on node R-5 into a high state 'H', and the inverter 1005-3 receiving the value on node R-5 converts the value on node R-6 into a low state 'L'.

Accordingly, the NMOS transistor 1011-1 receiving the reset bar signal resetb and the NMOS transistor 1011-2 receiving the value on node R-2 are turned off whereas the NMOS transistor 1013-1 receiving the value on node R-3 and the NMOS transistor 1013-2 receiving the value on node R-5 are turned on. The NMOS transistor 1011-3 receiving the value on node R-4 is turned off.

Because the NMOS transistor 1011-1 receiving the reset bar signal resetb is turned off, no electric current running on the NMOS transistors 1007-1 and 1011-1 is generated even if the value on node R-1 is in a high state 'H'. Even when a SLO signal is generated, the NMOS transistors 1009-1 and 1013-1 are all turned on, and electric current does not run unnecessarily because the value on node R-2 is in a low state 'L'. Likewise, when a SLE signal is generated, the NMOS transistors 1009-2 and 1013-2 are all turned on, and there is no electric current running worthlessly because the value on node R-4 is in a low state 'L'.

Here, the reset bar signal has the same phase as a comparison enable signal. It is not limited as an output of the inverter 1001 that receives a reset signal and the comparison enable signal can be used as it is. Also, as a matter of course, a phase of an input signal should be changed according to the kind of, MOS transistors used there. Thus, if a PMOS transistor is used as a MOS transistor 1011-1, the PMOS transistor may receive a reset signal.

The register controlled DLL circuit described above prevents an electric current from running on a shift register unnecessarily while the shift register is reset in a register controlled delay locked loop (DLL).

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A register controlled delay locked loop (DLL) comprising:
   a clock divider;
   a shift controller;
   a delaying circuit;
   a delay model to synchronize an external clock signal with an internal clock;
   a reset signal generation circuit to generate a reset signal used for initializing the DLL;
   a phase comparison circuit to initialize a phase comparison signal in which the phase of a feedback clock signal delayed by the delay model and a reference clock signal are compared to develop a predetermined signal by using a comparison enable signal having an inverse phase to that of the reset signal; and
   a shift register to block an electric current running on a first latch of a plurality of latches with the reset signal during the initialization of the DLL.

2. The register controlled DLL as recited in claim 1, wherein the reset signal generation circuit includes:
   a first inverter to receive a power-up signal which is generated when the power is increased to operate a semiconductor memory chip;
   a NOR gate to receive an output of the first inverter and a signal generated during a self-refresh operation;
   a second inverter to receive a signal ordering to operate without using the DLL;
   third and fourth inverters to receive a signal ordering to reset the DLL and to begin a new locking operation;
   a NAND gate to receive an output of the NOR gate, an output of the second inverter, and an output of the fourth inverter; and
   an even number of inverters arrayed in series, the even number of inverters being operable to receive an output of the NAND gate.

3. The register controlled DLL as recited in claim 2, wherein the reset signal generation circuit outputs the comparison enable signal from an output of an odd number of inverters among the even numbers of inverters serially arrayed.

4. The register controlled DLL as recited in claim 1, wherein the reset signal has a first logic condition when any one of the power-up signal, the signal generated during a self-refresh operation, the signal ordering to operate without using the DLL, or the signal ordering to reset the DLL and to begin a new locking operation is generated.

5. The register controlled DLL as recited in claim 1, wherein the phase comparison circuit includes:
   a first latch group in which a plurality of NAND gates are arrayed in parallel to compare the feedback clock signal with the reference clock signal, wherein one of the NAND gates receives the reference clock signal and an output from another NAND gate, which also receives the feedback clock signal and an output from yet another NAND gate among the plurality of the NAND gates;
   a pulse generator to generate a first phase comparison signal when the reference clock signal and the feedback clock signal are all in a first logic condition;
   a first NAND group in which a plurality of NAND gates are arrayed in parallel to receive an output of the pulse generator and outputs of the first latch group to output the value generated at the first latch group when the first phase comparison signal is in a first logic condition;
   a second latch group to output second and third phase comparison signals in different logic states according to the comparison enable signal, regardless of outputs of the first NAND group during the initialization;
   a third latch group in which a plurality of NAND gates are arrayed in parallel to compare a clock signal unit-delayed from the feedback clock signal with the reference clock signal, wherein one of the NAND gates receives the reference clock signal and an output from another NAND gate, which receives the clock signal and an output from yet another NAND gate among the plurality of the NAND gates;
   a second NAND group in which a plurality of NAND gates are arrayed in parallel to receive the output of the pulse generator and the output of the third latch group to output the value generated at the third latch group, when the first phase comparison signal is in a first logic condition; and
   a fourth latch group to output a fourth and fifth phase comparison signals in different logic states according to the comparison enable signal, regardless of the output of the second NAND group during the initialization.

6. The register controlled DLL as recited in claim 5, wherein the second phase comparison signal of the second latch group is an output of a first NAND gate that receives an output of one of the NAND gates of the first NAND group and the third phase comparison signal of the second latch group, and the third phase comparison signal of the second latch group is an output of a second NAND gate that receives the comparison enable signal, an output of the other NAND gate of the NAND gates of the first NAND group and the second phase comparison signal of the second latch group.

7. The register controlled DLL as recited in claim 5, wherein the fourth phase comparison signal of the fourth latch group is an output of a third NAND gate that receives an output of one of the NAND gates of the second NAND group and the fifth phase comparison signal of the fourth latch group, and the fifth phase comparison signal of the fourth latch group is an output of a fourth NAND gate that receives the comparison enable signal, an output of the other NAND gate of the NAND gates of the second NAND group and the fourth phase comparison signal of the fourth latch group.

8. The register controlled DLL as recited in claim 1, wherein the shift register uses an inverted signal to the reset signal as a control signal for a gate of an NMOS transistor serially connected to another NMOS transistor in the shift register that is turned on by an output of the shift controller during the initialization.

9. The register controlled DLL as recited in claim 8, wherein the shift register includes:
a first inverter to receive the reset signal from the reset signal generating circuit and to output a reset bar signal which is an inverted signal to the reset signal;
a first NAND gate to receive the reset bar signal and an output of a second inverter;
the second inverter to receive an output of the first NAND gate;
a first NMOS transistor in which the input of the second inverter is connected to a drain and a shift right control signal of the shift controller is inputted to a gate; and
a second NMOS transistor in which a source of the first NMOS transistor is connected to a drain and the reset bar signal is inputted to a gate.

10. The register controlled DLL as recited in claim 1, wherein the shift register uses a signal whose phase is substantially the same as that of the reset signal as a control signal for a gate of a PMOS transistor serially connected to an NMOS transistor in the shift register that is turned on by an output of the shift controller during the initialization.

11. A register controlled delay locked loop (DLL) comprising:
a clock divider;
a shift control circuit;
a delaying circuit;
a delay model to synchronize an external clock signal with an internal clock;
a reset signal generation circuit to generate a reset signal used for initializing the DLL and a comparison enable signal having an inverse phase to that of the reset signal;
a phase comparison circuit to receive the comparison enable signal and to initialize a phase comparison signal in which the phase of a delayed feedback clock signal is compared with a reference clock signal to develop a predetermined signal; and
a shift register to block an electric current running on a first latch of a plurality of latches by using a signal with the same phase as that of the comparison enable signal during the initialization of the DLL.

12. The register controlled DLL as recited in claim 11, wherein the reset signal has a first logic condition when any one of a power-up signal generated when the power is inputted to a semiconductor memory chip, a signal generated during a self-refresh operation a signal ordering to operate without using the DLL, and a signal ordering to reset the DLL circuit and begin a new locking operation is generated.

13. The register controlled DLL as recited in claim 11, wherein the phase comparison circuit includes:
a first latch group in which a plurality of NAND gates are arrayed in parallel to compare the feedback clock signal with the reference clock signal, wherein one of the NAND gates receives the reference clock signal and an output from another NAND gate, which also receives the delayed feedback clock signal and an output from yet another NAND gate among the plurality of the NAND gates;
a pulse generator to generate a first phase comparison signal when the reference clock signal and the delayed feedback clock signal are all in a first logic condition;
a first NAND group in which a plurality of NAND gates are arrayed in parallel to receive an output of the pulse generator and outputs of the first latch group to output the value generated at the first latch group when the first phase comparison signal is in a first logic condition;
a second latch group to output a second and third phase comparison signals in different logic states according to the comparison enable signal, regardless of outputs of the first NAND group during the initialization;
a third latch group in which a plurality of NAND gates are arrayed in parallel to compare a clock signal unit-delayed from the delayed feedback clock signal with the reference clock signal, wherein one of the NAND gates receives the reference clock signal and an output from another NAND gate, which receives the clock signal and an output from yet another NAND gate among the plurality of the NAND gates;
a second NAND group in which a plurality of NAND gates are arrayed in parallel to receive the output of the pulse generator and outputs of the third latch group to output the value generated at the third latch group, when the first phase comparison signal is in a first logic condition; and
a fourth latch group to output a fourth and fifth phase comparison signals in different logic states according to the comparison enable signal, regardless of outputs of the second NAND group during the initialization.

14. The register controlled DLL as recited in claim 13, wherein the second phase comparison signal of the second latch group is an output of a first NAND gate that receives an output of one of the NAND gates of the first NAND group and the third phase comparison signal of the second latch group, and the third phase comparison signal of the second latch group is an output of a second NAND gate that receives the comparison enable signal, an output of the other NAND gate of the NAND gates of the first NAND group and the second phase comparison signal of the second latch group.

15. The register controlled DLL as recited in claim 13, wherein the fourth phase comparison signal of the fourth latch group is an output of a third NAND gate that receives an output of one of the NAND gates of the second NAND group and the fifth phase comparison signal of the fourth latch group, and the fifth phase comparison signal of the fourth latch group is an output of a fourth NAND gate that receives the comparison enable signal, an output of the other NAND gate of the NAND gates of the second NAND group and the fourth phase comparison signal of the fourth latch group.

16. A method for controlling a register controlled delay locked loop (DLL) including a phase comparison circuit and a shift register, comprising:
generating a reset signal and a comparison enable signal;
controlling the phase comparison circuit in response to the comparison enable signal during initializing of the DLL; and
blocking an electric current running on a first latch of the shift register with the reset signal during initializing of the DLL.

17. The method as recited in claim 16, wherein the reset signal has a first logic condition when any one of a power-up signal generated when the power is inputted to a semiconductor memory chip, a signal generated during a self-refresh operation, a signal ordering to operate without using the DLL, and a signal ordering to reset the DLL and begin a new locking operation is generated.

18. The method as recited in claim 17, wherein the comparison enable signal has an inverse phase to that of the reset signal.

* * * * *

UNITED STATES PATENT AND TRADEMARK OFFICE
CERTIFICATE OF CORRECTION

PATENT NO. : 7,103,133 B2 Page 1 of 1
APPLICATION NO. : 10/223434
DATED : September 5, 2006
INVENTOR(S) : Hea-Suk Jung

It is certified that error appears in the above-identified patent and that said Letters Patent is hereby corrected as shown below:

In the Claims:

Column 9, line 52, "operation a signal" should be -- operation, a signal --.

Signed and Sealed this

Seventh Day of August, 2007

JON W. DUDAS
*Director of the United States Patent and Trademark Office*